United States Patent
Lee et al.

(10) Patent No.: US 7,126,271 B2
(45) Date of Patent: Oct. 24, 2006

(54) ORGANIC ELECTROLUMINESCENT DISPLAY DEVICE HAVING BI-LAYER ELECTRON INJECTION STRUCTURE

(75) Inventors: Jun Yeob Lee, Seongnam (KR); Jang Hyuk Kwon, Suwon (KR); Yong Joong Choi, Yougin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 232 days.

(21) Appl. No.: 10/648,194

(22) Filed: Aug. 27, 2003

(65) Prior Publication Data

US 2004/0207318 A1    Oct. 21, 2004

(30) Foreign Application Priority Data

Apr. 17, 2003   (KR) ...................... 10-2003-0024424

(51) Int. Cl.
*H05B 33/00* (2006.01)
(52) U.S. Cl. ....................... 313/506; 313/504
(58) Field of Classification Search ........ 313/504–506; 428/690
See application file for complete search history.

(56) References Cited

U.S. PATENT DOCUMENTS

| | | | |
|---|---|---|---|
| 5,776,622 A | 7/1998 | Hung et al. | |
| 6,396,209 B1 | 5/2002 | Kido et al. | |

FOREIGN PATENT DOCUMENTS

| | | |
|---|---|---|
| JP | 11-233262 | 8/1999 |
| JP | 2000-003790 | 1/2000 |
| JP | 2000-182774 | 6/2000 |
| JP | 2002-008863 | 1/2002 |
| JP | 2002-324680 | 11/2002 |
| KR | 1999-82912 | 11/1999 |

OTHER PUBLICATIONS

Kido, et al. "Invited Paper: Bright Organic EL Device Having Metal-Doped Electron-Injecting Layer," SID 97 Digest, 1997, pp. 775-777. no month.
Japanese Office Action issued May 22, 2006, in counterpart Japanese Patent Application No. 2003-282124 (in Japanese).

*Primary Examiner*—Joseph Williams
(74) *Attorney, Agent, or Firm*—Stein, McEwen & Bui, LLP

(57) ABSTRACT

An organic electroluminescent display device including a first electrode and a second electrode formed on a substrate, and a plurality of organic film layers between the first and second electrodes, including a first organic film layer provided between the emitting layer and the second electrode, and a second organic film provided between the emitting layer and the first organic film layer, wherein the first organic film layer includes a first organic metal complex compound, and the second organic film layer includes a mixture of a charge carrier transport material and a second organic metal complex compound.

30 Claims, 1 Drawing Sheet

ORGANIC ELECTROLUMINESCENT DISPLAY DEVICE HAVING BI-LAYER ELECTRON INJECTION STRUCTURE

CROSS-REFERENCE TO RELATED APPLICATION

This application claims the benefit of Korean Application No. 2003-24424, filed Apr. 17, 2003, in the Korean Intellectual Property Office, the disclosure of which is incorporated herein by reference.

BACKGROUND OF THE INVENTION

1. Field of the Invention

The present invention relates to an organic electroluminescent display device, and, more particularly, to a display device that has a low driving voltage, superior life span characteristics, and is stabilized to the external environment due to an improved electron transport layer and electron injection layer.

2. Description of Related Art

Recently, the organic electroluminescent display device is being noticed as a next generation display device owing to various qualities such as its narrow thickness, wide viewing angle, light weight, small size, fast response time, and low power consumption compared with a cathode-ray tube (CRT) or liquid crystal device (LCD).

Particularly, an organic electroluminescent display device has a quality of being easily fabricated through a simple fabrication process, due to its simple structure of an anode, organic film layer, and a cathode. The organic film layer consists of various layers according to functions, and may generally comprise a hole injection layer, a hole transport layer, a luminescent layer, an electron transport layer, and an electron injection layer.

In FIG. 1, holes are injected from the anode 7, which is a transparent electrode, so that the injected holes are transferred to an emitting layer 4 which is one of organic film layers 10 through a hole injection layer 6 and a hole transport layer 5, and electrons are injected from a cathode 1 so that the injected electrons are transferred to the emitting layer 4 through an electron injection layer 2 and an electron transport layer 3. The transferred electrons and holes are bonded in the emitting layer 4 to emit light.

There are methods for improving an electron transport layer and an electron injection layer in order to improve the driving voltage and life span of an organic electroluminescent display device. According to U.S. Pat. No. 5,776,622, characteristics of a device were improved by depositing a dielectric material such as LiF, $BaF_2$ and CsF to a thickness of about 1 nm between an electron transport layer and a metallic electrode to improve driving voltage.

Kido, et al., of Japan announced results in which a driving voltage was reduced by using a layer in which a material in the alkaline metal series, such as Li, is doped on an organic electron transport layer adjacent to the cathode as an electron injection layer (SID 97, Digest, page 775).

The reduction of the driving voltage by the doping of an alkaline metal results from the fact that electrons are more smoothly injected by removing an electron injection barrier from the cathode. However, the material in the Li series has a problem in that it is sensitive to oxidization, and is diffused to a large extent. Furthermore, a finely controlled doping concentration is required, since the concentration of a doping metal has an influence on the characteristics of a device in the case of metal doping.

Disclosed in U.S. Pat. No. 6,396,209 is a structure in which a mixed layer of an electron transporting organic compound and an organic metal complex compound is used as an electron injection layer, and a metal is deposited on the mixed layer to improve the characteristics of an organic electroluminescent display device. Using this electron transporting organic compound and the organic metal complex compound could reduce the driving voltage.

However, a structure of a new device for obtaining more stable device characteristics is required, since the methods discussed above have a high degree of difficulty in the depositing process, and also have a low device stability.

SUMMARY OF THE INVENTION

It is an aspect of the present invention to develop a structure of a device having a lower driving voltage by improving an electron transport layer and an electron injection layer when forming an organic electroluminescent display device.

It is another aspect of the present invention to improve a life span of the organic electroluminescent display device by improving an electron transport layer and an electron injection layer, thereby improving the stability of an organic electroluminescent display device.

It is another aspect of the present invention to improve the life span of the device by fabricating an organic electroluminescent display device that is stable to the external environment.

In order to achieve the foregoing and/or other aspects, the present invention provides an organic electroluminescent display device comprising a first electrode and second electrode formed on a substrate, and a plurality of organic film layers between the first and second electrodes, comprising an emitting layer, a first organic film layer provided between the emitting layer and the second electrode, and second organic film layer provided between the emitting layer and the first organic film layer.

The first organic film layer comprises a first organic metal complex compound, and the second organic film layer comprises a mixture of a charge transport material and a second organic metal complex compound.

Furthermore, the present invention may provide an organic electroluminescent display device comprising a first electrode and a second electrode formed on a substrate, a first layer comprising a metal halide, contacted with the second electrode, and a second layer comprising a mixture of a charge transport material and an organic metal complex compound, provided under the first layer.

The organic metal complex compound and the metal halide may comprise at least one metal selected from the group consisting of an alkali metal, an alkali earth metal, and a rare earth metal.

Additional aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE INVENTION

Figure 1:
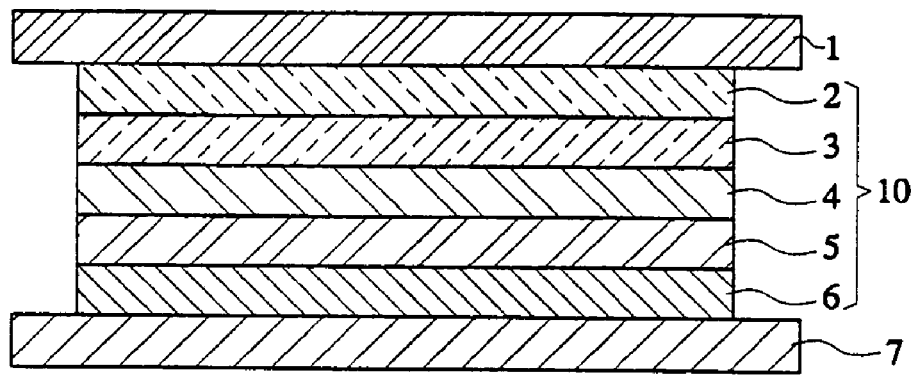
FIG. 1 is a drawing schematically illustrating the structure of an ordinary organic electroluminescent display device.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
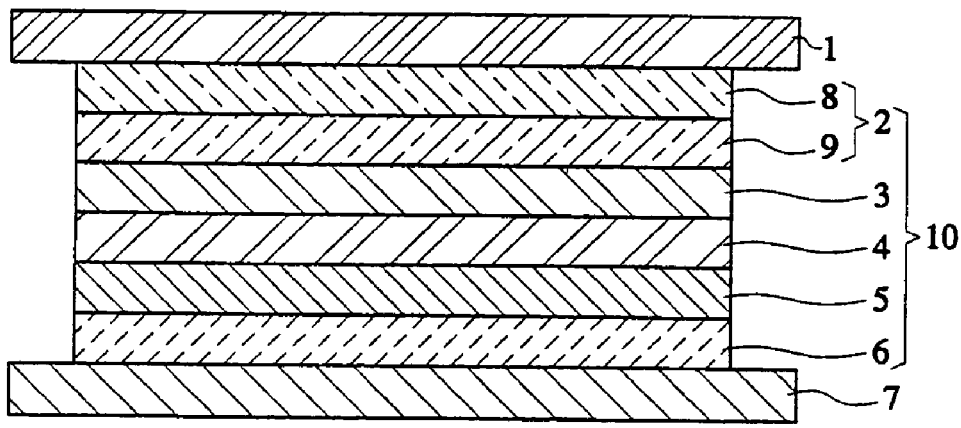
FIG. 2 is a drawing schematically illustrating the structure of an organic electroluminescent display device according to an embodiment of the present invention.

FIG. 1 is a drawing schematically illustrating the structure of an ordinary organic electroluminescent display device, and FIG. 2 is a drawing schematically illustrating the structure of an organic electroluminescent display device fabricated according to an embodiment of the present invention. The same marks are used for the same constituent elements hereinafter.

Referring to FIG. 2, an embodiment of the present invention comprises a first electrode 7 and a second electrode 1 formed on a substrate (not shown), and one or more organic film layers 10 positioned between the first electrode 7 and the second electrode 1. One or more emitting layers 4 are provided in the organic film layers 10, and a first organic film layer 8 is provided between the emitting layers 4 and the second electrode 1.

That is, the first organic film layer 8 is used in the present invention to improve the electron injection layer 2 found in the ordinary organic electroluminescent display device illustrated in FIG. 1.

Furthermore, an embodiment of the present invention further comprises a second organic film layer 9, between the emitting layers 4 and the first organic film layer 8, to further improve the transmission property of the electric charges.

The first organic film layer 8 of the present invention is formed using an organic metal complex compound. The organic metal complex compound includes tris(8-quinolinolato)aluminum and 8-quinolinolato lithium, comprising one or more 8-quinolinolatos as a ligand, and derivatives thereof.

The first organic film layer is preferably formed to a thickness of 0.5 to 10 nm. That is, it is not desirable to form the first organic film layer to a thickness of more than 10 nm, because the driving voltage of the device increases. And it is not desirable to form the first organic film layer to a thickness of less than 0.5 nm, because electron injection from the electrode is limited.

The organic metal complex compound comprises one or more alkali metal ions, alkali earth metal ions, and rare earth metal ions.

Furthermore, an embodiment of the present invention further comprises a second organic film layer 9, which is a thin film formed through a solution process by mixing a material used as an existing electron transport layer 3 with an organic metal complex compound, or may be formed by co-depositing the electron transport layer material and the organic metal complex compound under a vacuum, so that the two materials are mixed. The organic metal complex compound comprises tris(8-quinolinolato)aluminum and 8-quinolinolato lithium, comprising one or more 8-quinolinolatos as a ligand, and derivatives thereof, and comprises one or more alkali metal ions, alkali earth metal ions, and rare earth metal ions. The organic metal complex compound, having a concentration of 75% or less of the existing electron transport layer, is contained in the second organic film layer 9.

The existing electron transport layer material is not limited to a particular material, and typical electron transport layer materials are selected from the group consisting of polycyclic hydrocarbon series derivatives, heterocyclic compounds, and derivatives thereof.

The first organic film layer 8 comprises an organic metal complex compound that is a thin film positioned adjacently to the second electrode 1.

A metallic electrode is used as the second electrode 1 when the second electrode 1 is the cathode. Although the metallic electrode may comprise Al, Ag, Yt, metal halide, etc., the metallic electrode is not limited to those materials. ITO, or IZO, is used as the first electrode 7 when the first electrode 7 is the anode.

Another embodiment of the present invention comprises a metal halide as a first layer, instead of the first organic film layer 8 of the above cited embodiment, and a second layer of this embodiment of the present invention is the same as the second organic layer of the above cited embodiment of the present invention.

The metal halide comprises one or more metals selected from the group consisting of an alkali metal, an alkali earth metal, and a rare earth metal.

The thickness of the first layer is preferably 0.5 to 10 nm.

Furthermore, an organic electroluminescent display device according to this embodiment of the present invention further comprises an electron transport layer 3, or a hole retardation layer, to improve electrical characteristics. The electron transport layer 3, or the hole retardation layer, is formed between the emitting layer 4 and the second organic film layer 9. Materials used as ordinary electron transport layers or hole retardation layers are used to form the electron transport layer 3 or the hole retardation layer.

The luminescent principle of an organic electroluminescent display device according to an embodiment of the present invention is examined as follows. In FIG. 2, electrons are injected from the second electrode 1, and the first organic film layer 8, comprising an organic metal complex compound, removes an energy barrier to the second organic film layer 9, which is a mixed material of the electron transport layer material and the organic metal complex compound, so that the electrons generated from the second electrode 1 are easily injected into the second organic film layer 9.

That is, the first organic film layer 8 and the second organic film layer 9 perform the same function as an existing electron injection layer 2.

The second organic film layer 9, which is a mixed layer of the electron transport layer material and the organic metal complex compound, assists with the easy injection and transport of electrons, while an electron transport layer 3, or a hole retardation layer, assists with the transferring of electrons and the blocking of the movement of holes.

Holes passing through a hole injection layer 6 from the first electrode 7 are transferred through a hole transport layer 5 to an emitting layer 4 and are bonded with electrons from the second electrode 1 so as to emit light. The first electrode 7 is an ordinary anode electrode, and a transparent electrode such as ITO or IZO can be used as the first electrode 7.

In general, the performances of electroluminescent devices show maximum values in an electron injection layer thickness range between 1 nm and 4 nm. However, this thin an electron injection layer is too thin to form a continuous film. Instead, the electron injection layer in that thickness range forms an island structure.

To overcome this lack of uniformity, and to improve the electron injection from the second electrode 1 to the electron transport layer 3, a supplementary layer (the second organic film layer 9) comprising a mixture of an organic metal complex compound and an electron transport layer material was introduced as a second layer of a bi-layer electron injection structure. The bi-layer electron injection structure enhances the electron injection, which results in the improvement of the efficiency and lifetime of the device. A mixture of an organic metal complex compound and an electron transport layer material can also be used as an electron transport layer 3, as well as an electron injection layer 2.

A display device in an embodiment of the present invention lowers the driving voltage of the device, and increases the efficiency and luminance of the device, by using a thin film organic metal complex compound layer (the first organic film layer 8), thereby removing an electron injection barrier.

Furthermore, the display device in an embodiment of the present invention additionally lowers the driving voltage of the device, and increases the efficiency and luminance of the device, by introducing an electron injection layer 2, which in an embodiment of the present invention is a mixed layer of the existing electron transport layer 3 and an organic metal complex compound layer, allowing electrons to be transported more smoothly. The display device in an embodiment of the present invention also has an increased life span due to the improved stability of the device.

The same organic metal complex compounds, or different organic metal complex compounds, can be used in the first organic film layer 8 and the second organic film layer 9.

A few embodiments of the present invention are as follows. The following embodiments are only for helping to understand the present invention, but the present invention is not limited to the following embodiments.

EXAMPLE 1

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. Tris(8-quinolinolato)aluminum (Alq) was deposited at a thickness of 20 nm as an electron transport layer. A mixture in which tris(8-quinolinolato)aluminum (Alq) is mixed with 8-quinolinolato lithium (Liq), in a mixing ratio of 3:1, was deposited to a thickness of 1 nm on the electron transport layer under a vacuum of $10^{-6}$ torr, to serve as an electron transport layer. A pure Liq layer was deposited at a thickness of 1 nm on top of the mixed layer. After depositing Al as a metallic electrode, to a thickness of 300 nm, on the Liq electron injection layer, the resulting material was finally encapsulated using a metallic can and barium oxide.

An organic electroluminescent display device fabricated using the process shown above had a luminance of 1000 cd/m$^2$, an efficiency of 25 cd/A at 6 V, and a life span of 1000 hours at 400 cd/m$^2$.

EXAMPLE 2

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. Tris(8-quinolinolato)aluminum (Alq) was deposited at a thickness of 20 nm as an electron transport layer. A mixture in which tris(8-quinolinolato)aluminum (Alq) is mixed with 8-quinolinolato lithium (Liq), in a mixing ratio of 3:1, was deposited to a thickness of 1 nm on the electron transport layer under a vacuum of $10^{-6}$ torr, to serve as an electron transport layer. A pure lithium fluoride (LiF) layer was deposited at a thickness of 1 nm on top of the mixed layer. After depositing Al as a metallic electrode, to a thickness of 300 nm, on the LiF electron injection layer, the resulting material was finally encapsulated using a metallic can and barium oxide.

An organic electroluminescent display device fabricated using the process shown above had a luminance of 900 cd/m$^2$, an efficiency of 24 cd/A at 6 V, and a life span of 900 hours at 400 cd/m$^2$.

EXAMPLE 3

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. A mixture in which tris(8-quinolinolato)aluminum (Alq) is mixed with 8-quinolinolato lithium (Liq), in a mixing ratio of 3:1, was deposited to a thickness of 20 nm on the hole retardation layer under a vacuum of $10^{-6}$ torr, to serve as an electron transport layer, as well as an electron injection layer. A pure Liq layer was deposited at a thickness of 1 nm on top of the mixed layer. After depositing Al as a metallic electrode, to a thickness of 300 nm, on the Liq electron injection layer, the resulting material was finally encapsulated using a metallic can and barium oxide.

An organic electroluminescent display device fabricated using the process shown above had a luminance of 1200 cd/m², an efficiency of 27 cd/A at 6 V, and a life span of 1200 hours at 400 cd/m².

EXAMPLE 4

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. A mixture in which tris(8-quinolinolato)aluminum (Alq) is mixed with 8-quinolinolato lithium (Liq), in a mixing ratio of 3:1, was deposited to a thickness of 20 nm on the hole retardation layer under a vacuum of $10^{-6}$ torr, to serve as an electron transport layer, as well as an electron injection layer. A pure LiF layer was deposited at a thickness of 1 nm on top of the mixed layer. After depositing Al as a metallic electrode, to a thickness of 300 nm, on the LiF electron injection layer, the resulting material was finally encapsulated using a metallic can and barium oxide.

An organic electroluminescent display device fabricated using the process shown above had a luminance of 1100 cd/m², an efficiency of 26 cd/A at 6 V, and a life span of 1100 hours at 400 cd/m².

COMPARATIVE EXAMPLE 1

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. A mixture in which tris(8-quinolinolato) aluminum (Alq) is mixed with 8-quinolinolato lithium (Liq), in a mixing ratio of 1:1, was deposited to a thickness of 20 nm on the hole retardation layer under a vacuum of $10^{-6}$ torr, to serve as an electron transport layer. After depositing Al as a metallic electrode, to a thickness of 300 nm, on a mixed layer of Liq and Alq, the resulting material was finally encapsulated using a metallic can and barium oxide.

An organic electroluminescent display device fabricated using the process shown above had a luminance of 800 cd/m², an efficiency of 25 cd/A at 6 V, and a life span of 550 hours at 400 cd/m².

COMPARATIVE EXAMPLE 2

After depositing copper phthalocyanine (CuPc) to a thickness of 10 nm on an ITO transparent electrode under a vacuum of $10^{-6}$ torr, to serve as a hole injection layer of an organic electroluminescent display device, N,N'-di(1-naphthyl)-N,N'-diphenylbenzidine (NPD) was deposited to a thickness of 50 nm on the hole injection layer under a vacuum of $10^{-6}$ torr, to serve as a hole transport layer. After depositing the N,N'-di(1-naphthyl)-N,N'-diphenylbenzidine (NPD), a luminescent layer, in which iridium tris(phenylpyridine) (Irppy$_3$) was doped on carbazole biphenyl (CBP) to a concentration of 5%, was formed on the hole transport layer to a thickness of 30 nm. Biphenoxy-bi(8-quinolinolato)aluminum (BAlq) was deposited on the luminescent layer to a thickness of 5 nm, after depositing the luminescent layer on the hole transport layer, to serve as a hole retardation layer. Tris(8-quinolinolato)aluminum (Alq) was deposited to a thickness of 20 nm on the hole retardation layer, under a vacuum of $10^{-6}$ torr, to serve as an electron transport layer. 8-quinolinolato lithium (Liq) was deposited to a thickness of 3 nm on the electron transport layer, after depositing tris(8-quinolinolato)aluminum (Alq) as the electron transport layer, to serve as an electron injection layer. After depositing Al as a metallic electrode, to a thickness of 300 nm, on the Liq electron injection layer, the resulting material was finally encapsulated using a metallic can and barium oxide.

An organic electroluminescent display device fabricated using the process shown above had a luminance of 1000 cd/m², an efficiency of 21 cd/A at 6 V, and a life span of 500 hours at 400 cd/m2.

| Device structure | Luminance @6 v(nit) | Efficiency (cd/A) | Lifetime(h) |
| --- | --- | --- | --- |
| Al/Liq/Alq3:Liq/Alq3/EML (EXAMPLE 1) | 1000 | 25 | 1000 |
| Al/LiF/Alq3:Liq/Alq3/EML (EXAMPLE 2) | 900 | 24 | 900 |
| Al/Liq/Alq3:Liq/EML (EXAMPLE 3) | 1200 | 27 | 1200 |
| Al/LiF/Alq3:Liq/EML (EXAMPLE 4) | 1100 | 26 | 1100 |
| Al/Alq3:Liq/Alq3/EML (COMPARATIVE EXAMPLE 1) | 800 | 25 | 550 |
| Al/Liq/Alq3/EML (COMPARATIVE EXAMPLE 2) | 1000 | 21 | 500 |

An organic electroluminescent display device, according to an embodiment of the present invention, improved efficiency and luminance by 20% or more, and improved the life span 80% or more, compared with an organic electroluminescent display device having the conventional structure, by using a bi-layer electron injection layer or structure comprised of an organic metal complex compound layer and a mixture layer of electron transport layer material and an organic metal complex compound.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent display device comprising;
   a substrate;
   a first electrode and a second electrode formed on the substrate; and
   a plurality of organic film layers between the first and second electrodes, comprising:
   an emitting layer,
   a first organic film layer provided between the emitting layer and the second electrode, and
   a second organic film layer provided between the emitting layer and the first organic film layer,
   wherein the first organic film layer comprises a first organic metal complex compound, and the second organic film layer comprises a mixture of a charge carrier transport material and a second organic metal complex compound.

2. The organic electroluminescent display device according to claim 1, wherein a charge carrier of the charge carrier transport material is an electron.

3. The organic electroluminescent display device according to claim 1, wherein the charge carrier transport material comprises at least one material selected from the group consisting of a polycyclic hydrocarbon series derivative, a heterocyclic compound, and derivatives thereof.

4. The organic electroluminescent display device according to claim 1, wherein the first and second organic metal complex compounds each comprise at least one metal selected from the group consisting of an alkali metal, an alkali earth metal, and a rare earth metal.

5. The organic electroluminescent display device according to claim 4, wherein the first and second organic metal complex compounds comprise the same metal.

6. The organic electroluminescent display device according to claim 1, wherein the thickness of the first organic film layer is 10 nm or less.

7. The organic electroluminescent display device according to claim 1, wherein the thickness of the first organic film layer is 0.5 to 10 nm.

8. The organic electroluminescent display device according to claim 1, wherein the thickness of the second organic film layer is 10 nm or less.

9. The organic electroluminescent display device according to claim 1, wherein the second organic film layer comprises 75% or less of the charge carrier transport material.

10. The organic electroluminescent display device according to claim 1, wherein the first and second organic metal complex compounds each comprise one compound selected from the group consisting of tris(8-quinolinolato) aluminum and 8-quinolinolato lithium, comprising one or more 8-quinolinolatos as a ligand, and derivatives thereof.

11. The organic electroluminescent display device according to claim 1, further comprising a hole retardation layer.

12. The organic electroluminescent display device according to claim 1, wherein the first electrode is an anode, and the second electrode is a cathode comprised of at least one metal selected from the group of Al, Ag, Yt, and metal halide.

13. The organic electroluminescent display device according to claim 1, wherein the mixture of the charge carrier transport material and the second organic metal complex compound is formed through a solution process.

14. The organic electroluminescent display device according to claim 1, wherein the mixture of the charge carrier transport material and the second organic metal complex compound is formed by co-depositing the charge carrier transport material and the second organic metal complex compound under a vacuum so that the two materials are mixed.

15. The organic electroluminescent display device according to claim 1, wherein the first organic film layer is positioned adjacent to the second electrode.

16. An organic electroluminescent display device comprising;
   a substrate;
   a first electrode and a second electrode formed on the substrate;
   a first layer comprising a metal halide, contacted with the second electrode; and
   a second layer comprising a mixture of a charge carrier transport material and an organic metal complex compound, deposited under the first layer.

17. The organic electroluminescent display device according to claim 16, wherein a charge carrier of the charge carrier transport material is electron.

18. The organic electroluminescent display device according to claim 16, wherein the charge carrier transport material comprises at least one material selected from the group consisting of a polycyclic hydrocarbon series derivative, a heterocyclic compound, and derivatives thereof.

19. The organic electroluminescent display device according to claim 16, wherein the organic metal complex compound and the metal halide each comprises at least one metal selected from the group consisting of an alkali metal, an alkali earth metal, and a rare earth metal.

20. The organic electroluminescent display device according to claim 16, wherein the thickness of the first layer is 10 nm or less.

21. The organic electroluminescent display device according to claim 16, wherein the thickness of the first layer is 0.5 to 10 nm.

22. The organic electroluminescent display device according to claim 16, wherein the thickness of the second layer is 10 nm or less.

23. The organic electroluminescent display device according to claim 16, wherein the organic metal complex compound in the second layer comprises 75% or less of the mixture of the charge carrier transport material and the organic metal complex compound.

24. The organic electroluminescent display device according to claim 16, wherein the organic metal complex compound of the second layer is one compound selected from the group consisting of tris(8-quinolinolato)aluminum and 8-quinolinolato lithium, comprising one or more 8-quinolinolatos as a ligand, and derivatives thereof.

25. The organic electroluminescent display device according to claim 16, further comprising a hole retardation layer.

26. An organic electroluminescent display device comprising:
   a bi-layer electron injection structure comprising:
      a first organic film layer comprising a first organic metal complex compound; and
      a second organic film layer comprising a second organic metal complex compound mixed with an electron transport material.

27. An organic electroluminescent display device comprising:
- a bi-layer electron injection structure comprising:
    - a first layer; and
    - a second layer comprising a mixture of an organic metal complex compound and an electron transport material.

28. The organic electroluminescent display device according to claim 16, further comprising an emitting layer deposited under the second layer;
- wherein the first layer is between the emitting layer and the second electrode; and
- wherein the second layer is between the emitting layer and the first layer.

29. The organic electroluminescent display device according to claim 26, further comprising:
- an electrode; and
- an electron transport layer;
- wherein the first organic film layer is between the electron transport layer and the electrode; and
- wherein the second organic film layer is between the electron transport layer and the first organic film layer.

30. The organic electroluminescent display device according to claim 27, further comprising:
- an electrode; and
- an electron transport layer;
- wherein the first layer is between the electron transport layer and the electrode; and
- wherein the second layer is between the electron transport layer and the first layer.

* * * * *

UNITED STATES PATENT AND TRADEMARK OFFICE
CERTIFICATE OF CORRECTION

| | |
|---|---|
| PATENT NO. | : 7,126,271 B2 |
| APPLICATION NO. | : 10/648194 |
| DATED | : October 24, 2006 |
| INVENTOR(S) | : Jun-Yeob Lee et al. |

It is certified that error appears in the above-identified patent and that said Letters Patent is hereby corrected as shown below:

Item (75) Inventors, change 3rd city from "Yougin" to --Yongin --

Column 10, line 20, insert -- an-- before "electron"

Signed and Sealed this

Twentieth Day of February, 2007

JON W. DUDAS
*Director of the United States Patent and Trademark Office*